United States Patent [19]
Takata

[11] Patent Number: 5,823,815
[45] Date of Patent: Oct. 20, 1998

[54] STRUCTURE OF INTERCONNECTING UNITS WITH RESPECTIVE CONNECTORS

[75] Inventor: Kensaku Takata, Nagoya, Japan

[73] Assignees: Harness System Technologies Research, Ltd., Nagoya; Sumitomo Wiring Systems, Ltd., Yokkaichi; Sumitomo Electric Industries, Ltd., Osaka, all of Japan

[21] Appl. No.: 828,299

[22] Filed: Mar. 28, 1997

[30] Foreign Application Priority Data

| Apr. 2, 1996 | [JP] | Japan | .................................. | 8-080332 |
| Apr. 26, 1996 | [JP] | Japan | .................................. | 8-107995 |

[51] Int. Cl.⁶ .................................................. H01R 13/64
[52] U.S. Cl. ........................................ 439/374; 439/248
[58] Field of Search .................................... 439/374, 376, 439/377, 247, 248, 557

[56] References Cited

U.S. PATENT DOCUMENTS

| 4,939,622 | 7/1990 | Weiss et al. | ........................ 439/374 X |
| 5,155,784 | 10/1992 | Knott | ...................................... 439/248 |
| 5,385,481 | 1/1995 | Kotyuk | . |
| 5,605,150 | 2/1997 | Radons et al. | ...................... 439/247 X |

FOREIGN PATENT DOCUMENTS

| 0-441-477-A1 | 10/1991 | European Pat. Off. . |
| 0-717-470-A2 | 6/1996 | European Pat. Off. . |
| U-64-27982 | 2/1989 | Japan . |
| U-1-142345 | 9/1989 | Japan . |
| Y2-6-19150 | 5/1994 | Japan . |
| U-7-1574 | 1/1995 | Japan . |
| WO-88/08662 | 11/1988 | WIPO . |

*Primary Examiner*—Khiem Nguyen
*Attorney, Agent, or Firm*—Oliff & Berridge, PLC

[57] ABSTRACT

A first connector is connected to a second connector while inserting an instrument unit into a unit insertion recess in an instrument panel, and the unit is positioned by pins, and is fixed. The unit insertion recess has an introductory portion and an open portion, and guide grooves for respectively guiding stabilizers formed on the unit are formed in the introductory portion. The second connector is displaceably mounted. When the instrument unit reaches a position where the second connector is slightly fitted in the first connector, and the pins on the panel are not yet passed respectively through positioning holes in the instrument unit, the stabilizers are disengaged respectively from the guide grooves to be received in the open portion, so that the position limitation is released.

22 Claims, 12 Drawing Sheets

STRUCTURE OF INTERCONNECTING UNITS WITH RESPECTIVE CONNECTORS

BACKGROUND OF THE INVENTION

1. Field of the Invention

This invention relates to a structure of interconnecting units with respective connectors, in which electric units are electrically connected together, with their respective connectors interconnected.

2. Description of the Related Art

Generally, in an electrical connection between electric units (for example, an electrical connection between a dashboard and an instrument panel in a vehicle), for example, when there are a first unit and a second unit to be connected together, a first connector is provided on the first unit while a second connector is provided on the second unit, and the two units are electrically connected together through the connection between the two connectors.

In one method of connecting the two connectors together, the first connector is beforehand attached to the first unit, and the second connector is beforehand attached to the second unit, and the mounting position of the first connector relative to the first unit, as well as the mounting position of the second connector relative to the second unit, is so determined that housings of the two connectors can be fitted together simultaneously when the two units are connected together.

However, in such a method, since it is necessary to interconnect the two units while registering the two connectors with each other, the operation is troublesome, and besides if there is even a slight error in the mounting position of one of the connectors, there is a possibility that the two connectors can not be connected together. If the connection between the two units is forcibly effected despite improper fitting between the two housings, it is possible that the connector housings are damaged.

Therefore, recently, there has been used a structure in which the two units are guided relative to each other in a connector-connecting direction, and the two connectors are guided relative to each other so that the connector housings can be fitted together easily and reliably, and one of the connectors is mounted on the associated unit for allowing the movement in a direction perpendicular to the connector-connecting direction so that an error in the mounting position of the connectors can be absorbed (Japanese Utility Model Unexamined Publication No. 1-142345).

However, the above interconnecting structure is not always entirely satisfactory for the type of structure in which the two units are positioned with respect to each other, and are interconnected, such for example as a structure in which a projection is formed on one of the units, and this projection is fitted into a positioning hole, formed in the other unit, when interconnecting the two units.

More specifically, if a clearance of the above guide structure is set to a small value so that the two connectors can be connected together more easily and reliably, the positioning of the two units with respect to each other is difficult or impossible when there is an error in the positional relation of the units limited by the guide portion. And besides, if the two units are forcibly connected together in such a condition, there is a fear that a strain develops in the two units, and in some cases abnormal noises may be produced by vibrations. Therefore, the reduction of the above clearance is limited, and this is not sufficient to achieve the easy and reliable connection between the two connectors.

It may be proposed to increase the above clearance and to increase a tapering portion for guiding purposes formed on a front end of the connector, but in this case there is encountered a problem that the size of the connector becomes too large, and this fails to meet with the requirement of a compact design.

Further, another two following structures in which at least one of the two connectors has been mounted on the associated unit for slight movement relative thereto so that an error in the mounting position of each connector can be absorbed are known.

(A) Ring-shaped spring members, which are resiliently deformable inwardly, are mounted on an outer peripheral portion of a connector body, and a panel, to which the connector is attached, is divided into an upper panel and a lower panel, and a groove is formed in each of the two panels, and the two panels are connected together, with the spring members received in the grooves, thereby holding the connector (see FIG. 1 of Japanese Utility Model Unexamined Publication No. 64-27982). In this structure, in accordance with the deformation of the spring members, the connector body can be displaced in a direction of the movement of the spring members.

(B) A connector holding member, which holds a connector in a manner to allow a slight movement of the connector, is attached to a mounting portion of a predetermined unit. Namely, the connector is mounted on the unit through the connector holding member (see Japanese Utility Model Examined Publication No. 6-19150 and FIG. 3 of the above Japanese Utility Model Unexamined Publication No. 64-27982).

In the structure (A), for mounting the connector, the panel must be divided into the upper and lower portions, and the grooves for receiving the spring members must be formed respectively in these panel portions, and therefore there is encountered a disadvantage that the structure of the panel is complicated, so that the cost is increased.

In the structure (B), in addition to the connector and the mounting member to which the connector is attached, the connector holding member of a special configuration must be used, and therefore there is a disadvantage that the number of the component parts increases, so that the cost is increased. Particularly when the connector is of a large size, the connector holding member must be increased in size, and the overall structure is very bulky.

SUMMARY OF THE INVENTION

The present invention has been made in order to solve the above problems, and an object of the invention is to provide a structure of interconnecting units with respective connectors, in which the two connectors can be easily and reliably connected together when positioning and interconnecting the two units, and the two units can be interconnected in a properly-positioned condition.

According to the present invention, there is provided a unit interconnecting structure with a connector includes: a first unit having a first connector; a second unit having a second connector, said second unit connected to the first unit; and guide parts for guiding the first and second units relative to each other in the connector-connecting direction, the guide parts provided on the first and second units; wherein at least one of the first and second connectors is mounted to allow the movement relative to the associated unit in a direction perpendicular to a connector-connecting direction; further wherein at the time of interconnecting the first and second units, the guide parts guides the first and second units relative to each other until one unit of the first and second units reaches a predetermined fitting initiation position where housings of the first and second connectors begin to be fitted together, and the guide parts releases the guide when the one unit moves beyond the fitting initiation position.

With this structure, when interconnecting the units, the two units are guided relative to each other by the guide parts until the unit reaches the fitting initiation position, and therefore the fitting between the housings of the two connectors can be started easily and positively. Then, after the unit advances beyond the fitting initiation position, the guiding by the guide parts is released, so that the relative movement of the two units in other direction than the connector-connecting direction is allowed, and therefore the two units can be connected together while suitably positioning the two units relative to each other by the positioning parts. At this time, one of the connectors is mounted for allowing the movement in a direction perpendicular to the connector-connecting direction, and therefore even if there is an error in the mounting position of the two connectors, this error is absorbed by the movement of the one connector, so that the connection between the two connectors, as well as the connection between the two units, can be effected smoothly.

DETAILED DESCRIPTION OF THE INVENTION

Figure 1:
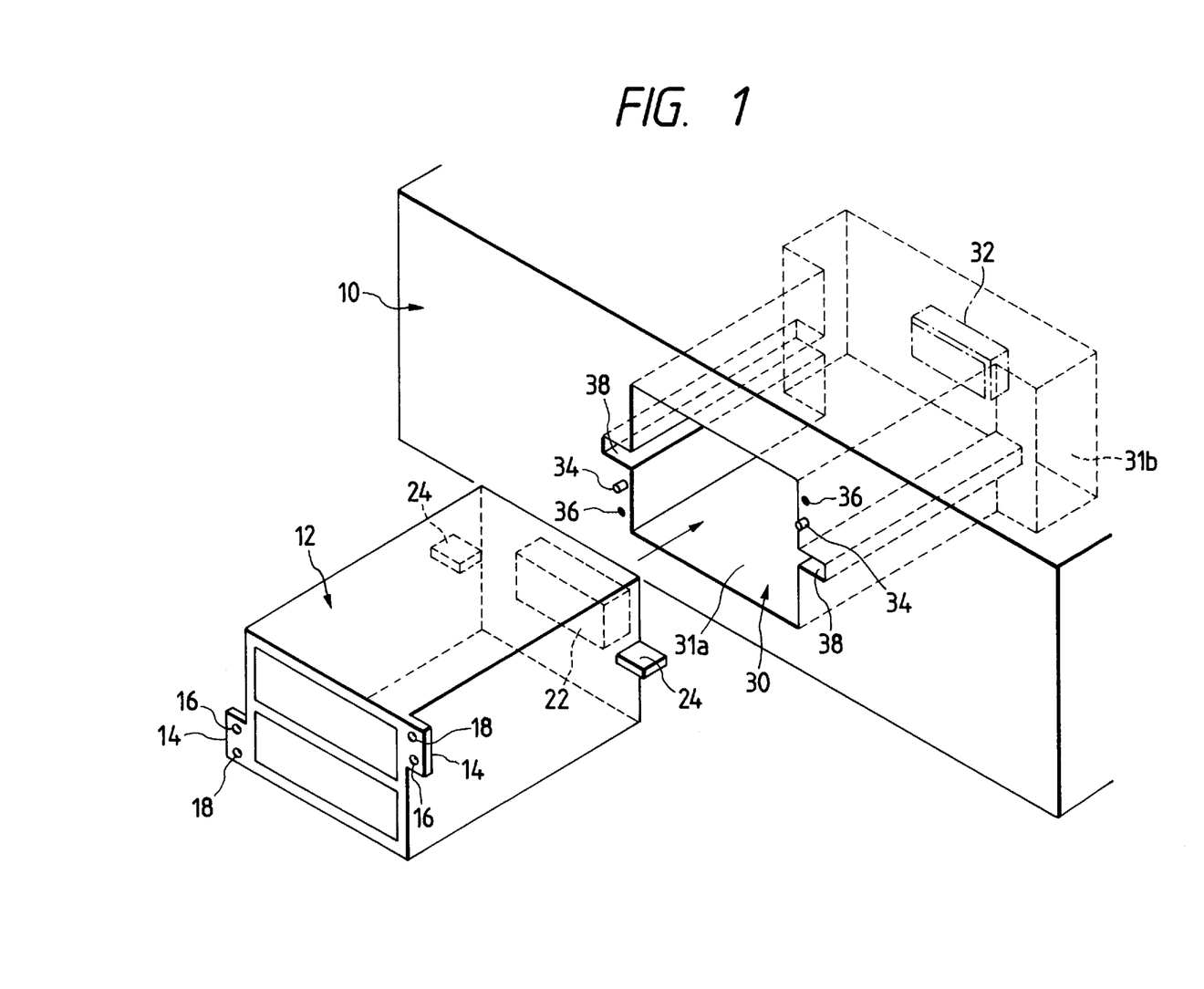
FIG. 1 is a schematic, perspective view showing an instrument panel and an instrument unit to which the present invention is applied.
Figure 2:
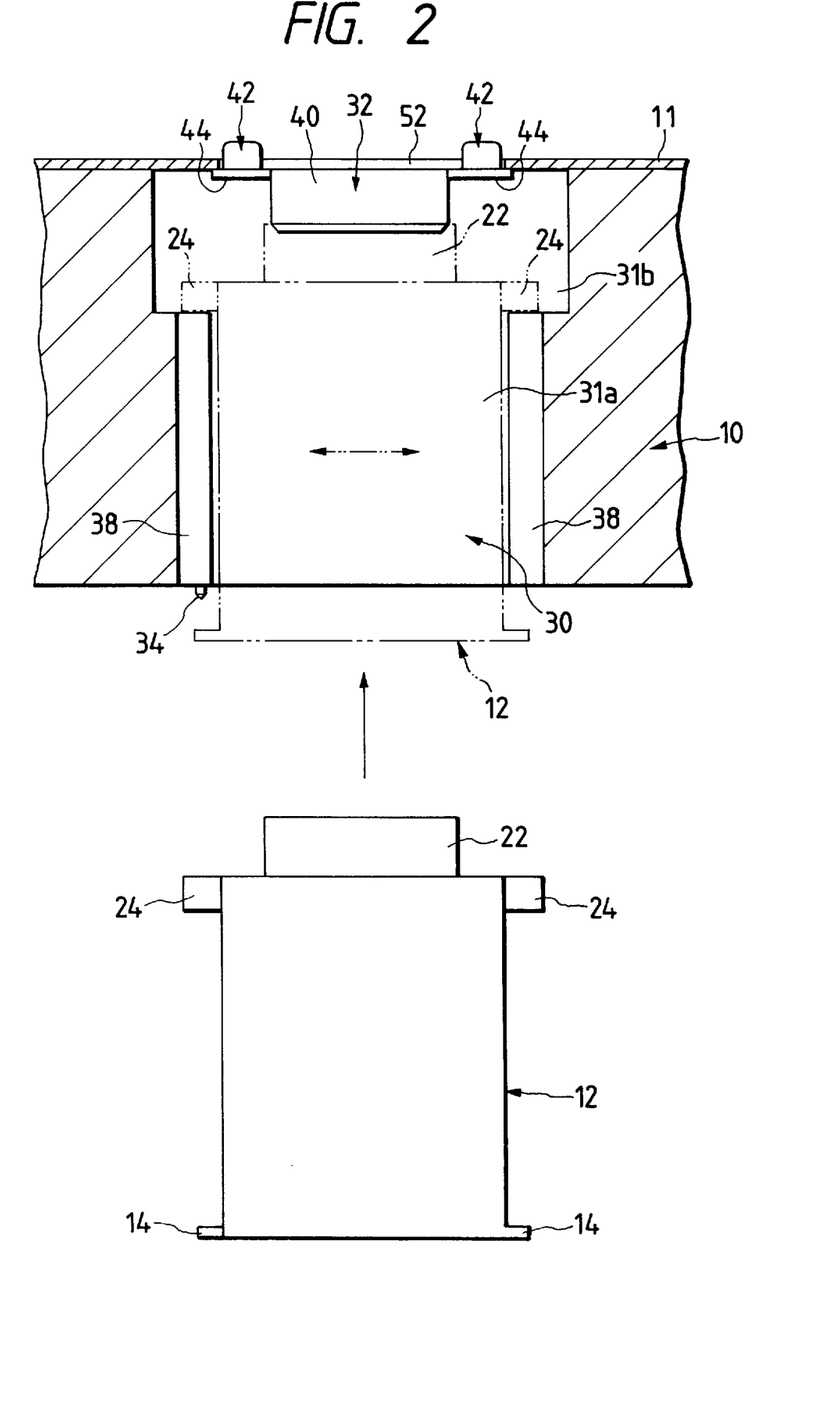
FIG. 2 is a schematic, cross-sectional view of FIG. 1.

FIGS. 1 and 2 show an instrument panel of a vehicle and an instrument unit to be mounted on this panel, and the present invention is applied to a structure of interconnecting the instrument panel and the instrument unit.

As shown in these Figures, a unit insertion recess 30 for receiving the instrument unit 12 (hereinafter referred to as "unit 12") is formed in the instrument panel 10 (hereinafter referred to as "panel 10"), and a pair of pins 34 and a pair of screw holes 36, which are used for positioning and fixing the unit 12, are formed at two portions of the panel 10 adjacent an inlet portion of the unit insertion recess 30. Flanges 14 are formed at a front side (lower side in FIG. 2) of the unit 12, and are provided respectively at those portions corresponding to the two sets of pins 34 and screw holes 36. A positioning hole 16 for passing the pin 34 therethrough, and a bolt insertion hole 18 are formed to penetrate each of the flanges 14. When the unit 12 is inserted into the unit insertion recess 30, the pins 34 are passed respectively through the positioning holes 16, and also bolts are passed through the respective bolt insertion holes 18 and are threaded into the respective screw holes 36. Thus, the unit 12 is fixed to the panel 10 in a positioned condition.

A first connector 22 is provided on the unit 12, and a second connector 32 is provided on the panel 10, and when the unit 12 is connected to the panel 10 as described above, the panel 10 and the unit 12 are electrically connected together through the two connectors 22 and 32.

The first connector 22 is fixedly secured by bolts or the like to that surface or side of the unit 12 facing the panel 10, and this fixed position is opposed to the second connector 32. Although not shown in the drawings, the first connector 22 includes a female housing having a housing fitting recess in its central portion, and a housing of the second connector 32 can be fitted in this housing fitting recess. An outwardly-spreaded, tapering surface is formed at an inlet portion of the housing fitting recess so that the housing can be easily fitted into this recess.

The second connector 32 includes the male housing which is fitted into the housing of the first connector 22. As shown in FIG. 2, the second connector 32 is mounted through a mounting panel 11 on an inner end (upper end in FIG. 2) of the unit insertion recess 30 in a connector-connecting direction, and is provided at such a position as to face the first connector 22. The second connector 32 is resiliently displaceable relative to the panel 10.

More specifically, as shown in FIGS. 4 to 10B, the second connector 32 includes a connector body 40 extending in a right-left direction (FIG. 2), and spring mounting portions 42 of a synthetic resin or the like integrally formed respectively at opposite (right and left) ends of the connector body 40. Regarding to the spring mounting portion 42, a base plate 44 is formed integrally with and extends outwardly from each of the opposite (right and left) end of the connector body 40, and a spring support post 46 projects from the base plate 44 toward the panel 11. A plurality of (three in this embodiment) turning springs 48 extend from a distal end of the spring support post 46 in a direction opposite to the direction of projecting of the spring support post 46. One of the turning springs 48 is turned from the spring support post 46 to the upper side, another turning spring 48 is turned to the lower side, and the other turning spring 48 is turned to the outer side in the right (left) direction. An abutment piece portion 50 is formed on each turning spring 48 adjacent to a distal end thereof, and is directed outwardly. A rib 52 is formed between the abutment piece portion 50 and a body of the turning spring 48. A release hole 60 is formed for molding the turning spring portion 42.

A slit 62 of a generally U-shape is formed through each base plate 44, and is disposed outwardly of the spring support post 46, and a portion of the base plate 44 lying outwardly of this slit 62 serves as a holding portion 64 which is elastically deformable independently of the portion of the base plate 44 lying inwardly of the slit 62. Opposite side or wing portions of the holding portion 64 are reduced in thickness to provide thinned portions 66. With this arrangement the holding portion 64 can be easily elastically deformed in a direction (upward-downward direction in FIG. 9) perpendicular to the mounting surface of the mounting panel 11. Holding projections 68 are formed at a distal end of the holding portion 64 in a direction toward the mounting surface of the mounting panel 11.

Figure 4:
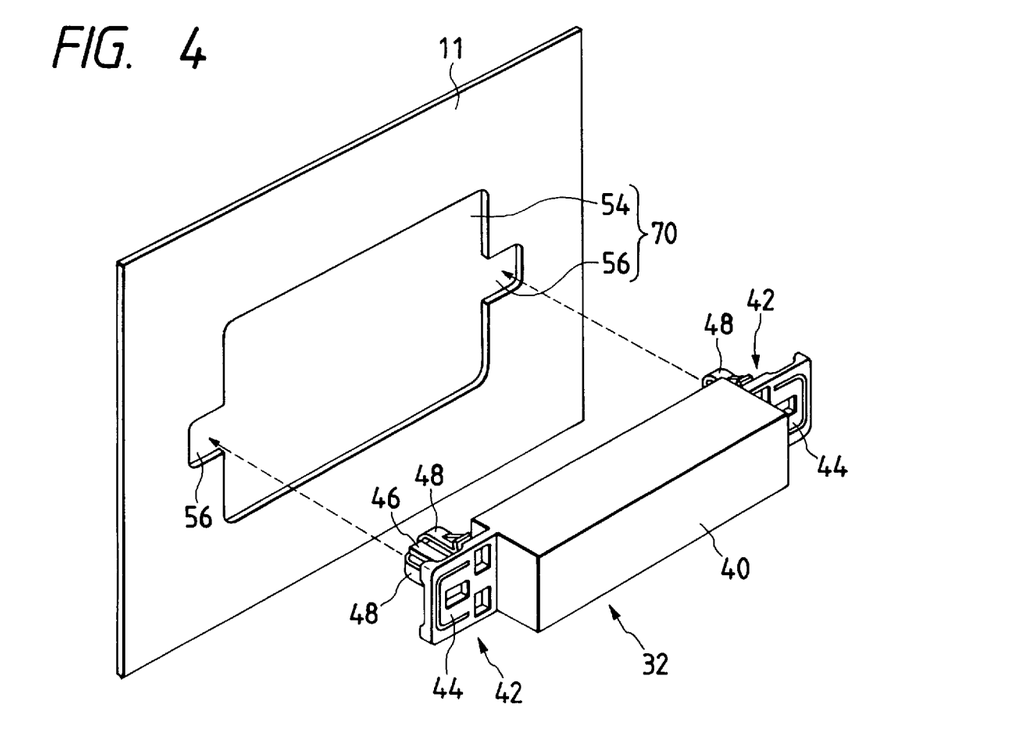
FIG. 4 is a schematic, perspective view showing the structure of a connector mounted on the instrument panel.
Figure 5:
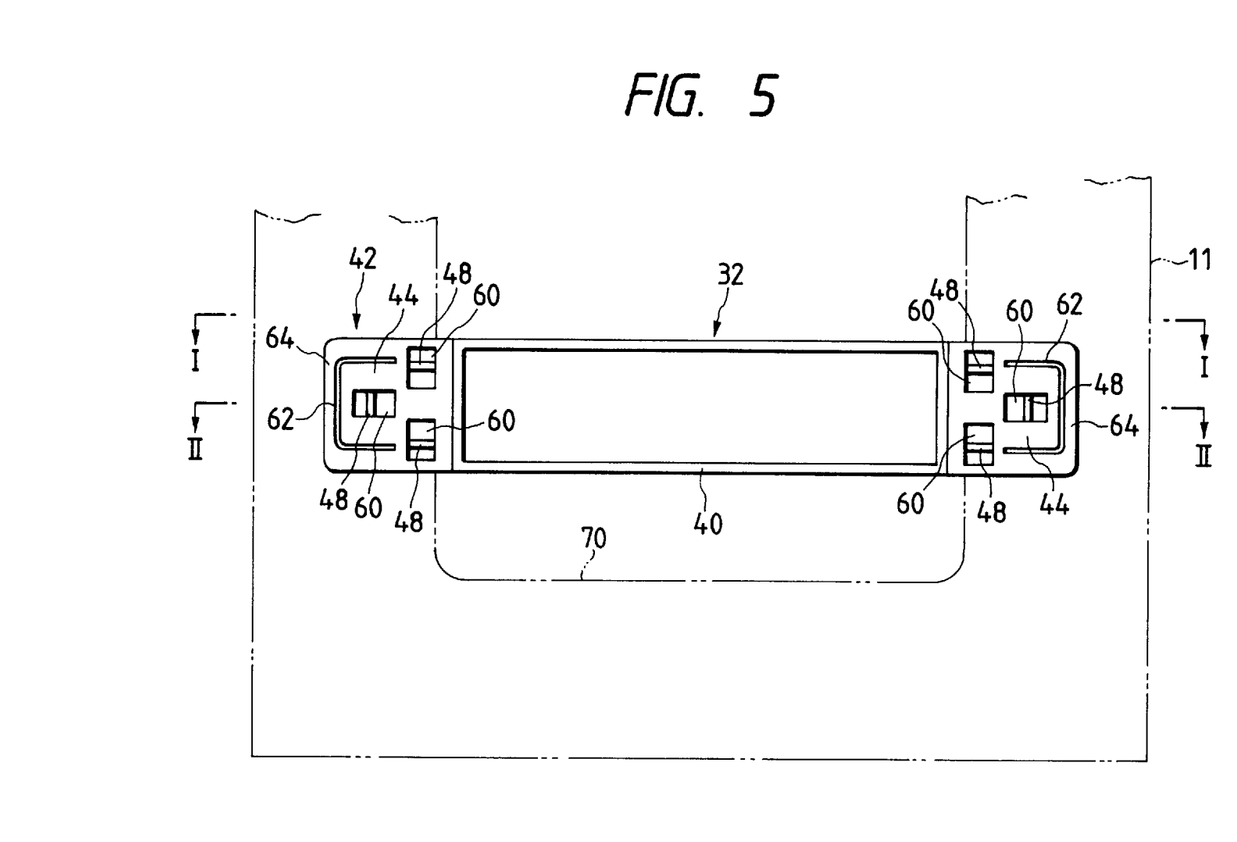
FIG. 5 is a front-elevational view showing the connector and the connector mounting structure.
Figure 6A:
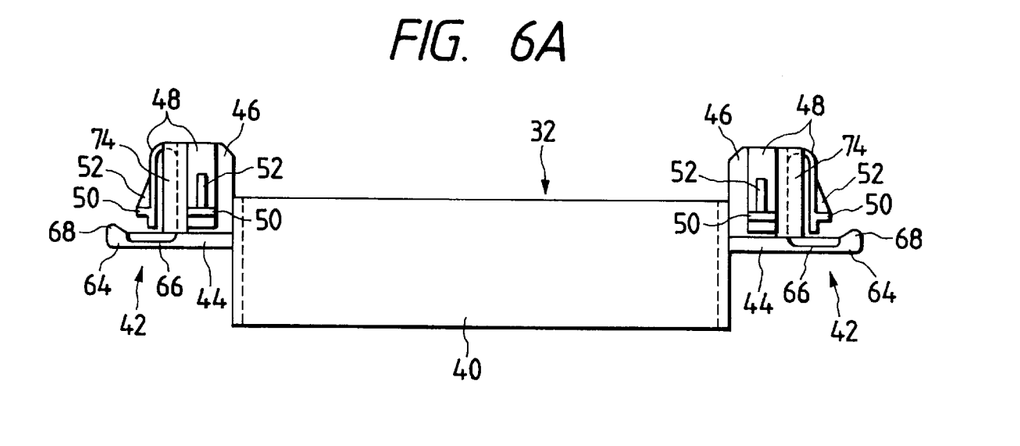
FIG. 6A is a cross-sectional view taken along the line I—I of FIG. 5.
Figure 6B:
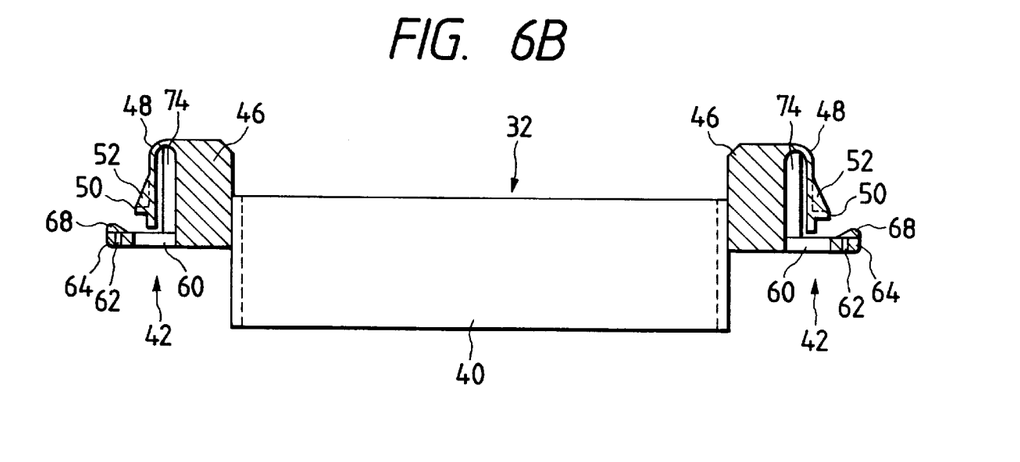
FIG. 6B is a cross-sectional view taken along the line II—II of FIG. 5.

A through hole 70 is formed through the mounting panel 11 as shown in FIG. 4. The overall configuration of the through hole 70 is a combination of a rectangular hole 54 having such a width as to allow the connector body 40 to be fitted therein and spring mounting holes 56 of a generally square shape formed respectively in opposite side edges of the rectangular portion 54, the spring mounting holes 56 being formed respectively at those portions corresponding respectively to the spring mounting portions 42.

Each spring mounting hole 56 has such a configuration that the distal end portions of the turning spring portions 48 can be engaged with a peripheral edge portion 72 of the spring mounting hole 56 while the spring support post 46 is extended through the spring mounting hole 56. That is, the distal end portions of the turning spring portions 48 can be fitted in the spring mounting hole 56 while the abutment piece portions 50 are held against the peripheral edge portion 72 of the spring mounting hole 56 at the reverse side of the mounting panel 11, as shown in FIG. 8C.

Figure 7:
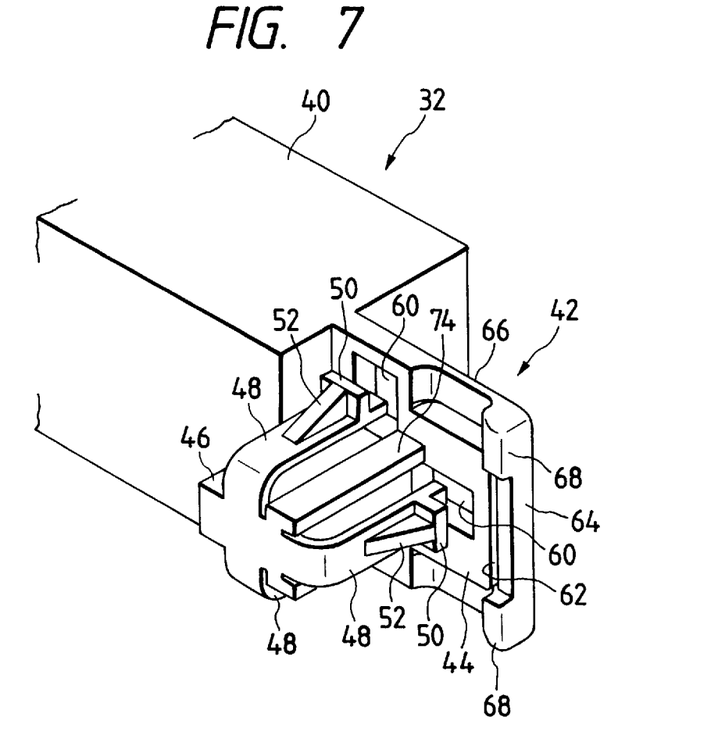
FIG. 7 is a perspective view showing a spring mounting portion formed on the connector.

In FIG. 7, protective walls 74 is formed to protect the turning spring portion 48 from the opposite sides, and to limit the lateral movement of the turning spring portion 48.

A procedure of mounting the second connector 32 in this structure will now be described.

Figure 8A:
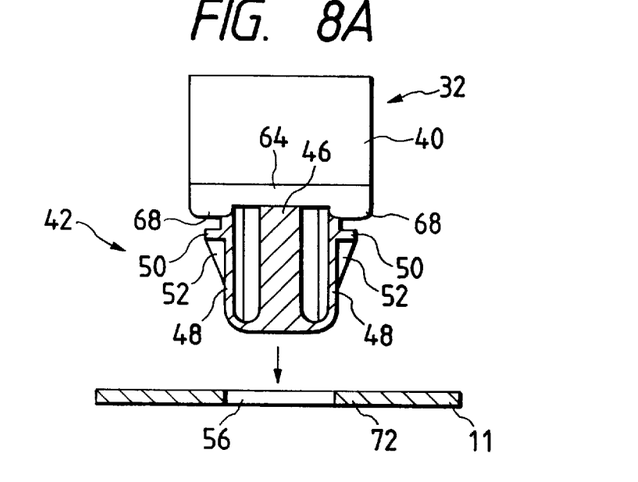
FIG. 8A is a cross-sectional view showing a condition in which the spring mounting portion is opposed to a spring mounting hole in a panel.
Figure 8B:
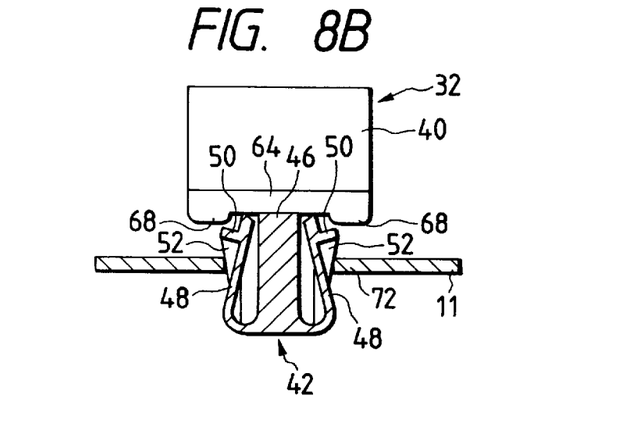
FIG. 8B is a cross-sectional view showing the process of press-fitting the spring mounting portion into the spring mounting hole.
Figure 8C:
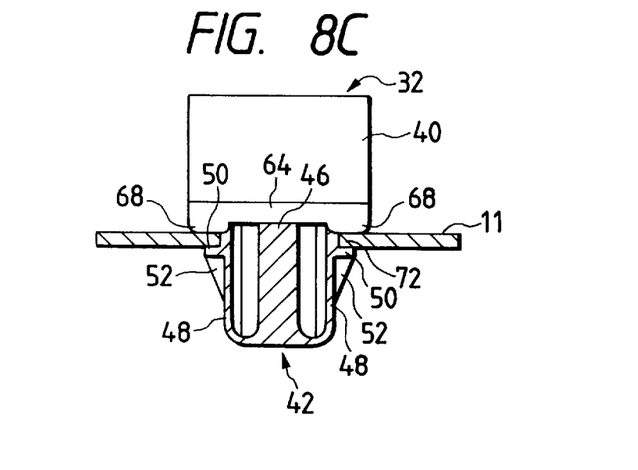
FIG. 8C is a cross-sectional view showing a condition in which the press-fitting of the spring mounting portion is completed.
Figure 9:
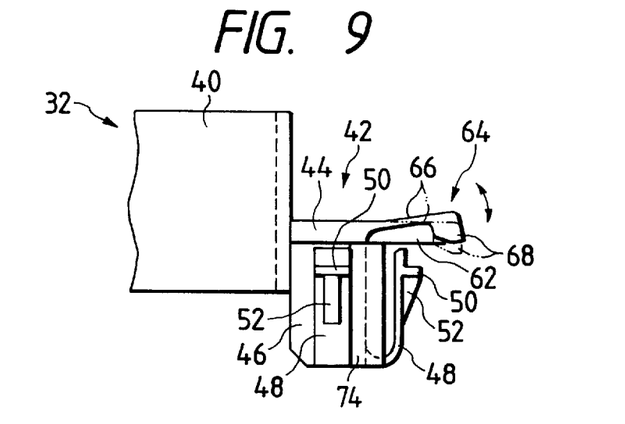
FIG. 9 is a plan view showing the spring mounting portion.

At first, the spring mounting portions 42 are opposed respectively to the spring mounting holes 56 as shown in FIG. 8A, and are pushed into these holes 56, respectively. During this pushing operation, the turning spring portions 48 on each spring support post 46 are resiliently deformed inwardly, and the edges of the ribs 52 slidingly contact the peripheral edge portion 72 of the spring mounting hole 56, as shown in FIG. 8B. When the abutment piece portions 50 pass through the spring mounting hole 56, the turning spring portions 48 are restored into their initial configuration, and their distal end portions are engaged with the peripheral edge portion 72 of the spring mounting hole 56, as shown in FIG. 8C.

At this time, the holding portion 64 of the base plate 44 is elastically deformed. Because of this elastic force, the holding portion 64 cooperates with the turning spring portions 48 to hold the peripheral edge portion 72 from the opposite sides of the mounting panel 11. As a result, the second connector 32 is mounted on the mounting panel 11 in a stable manner.

Figure 10A:
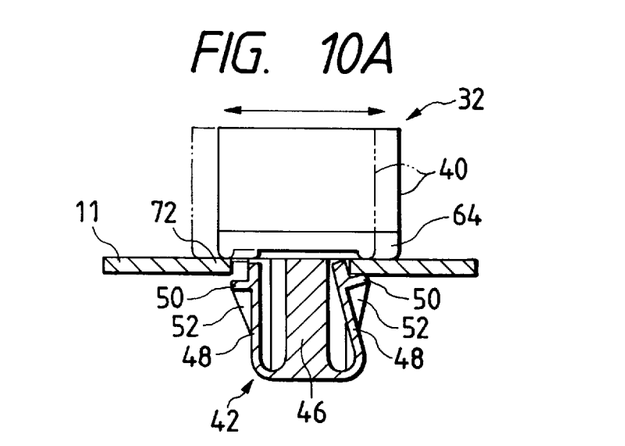
FIG. 10A is a cross-sectional view showing a condition in which a connector body is displaced in a direction parallel to a mounting surface in accordance with resilient deformation of turning spring portions on the spring mounting portion.
Figure 10B:
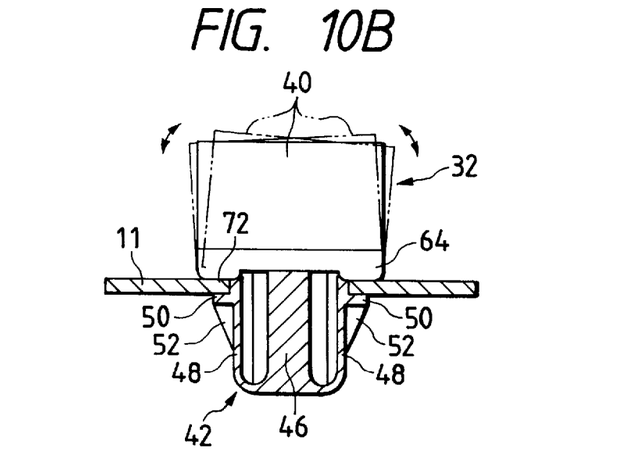
FIG. 10B is a cross-sectional view showing a condition in which the connector body is inclined.

In this mounted condition, the turning spring portions 48 can be suitably resiliently deformed. Therefore, because of this resilient deformation, the connector body 40 can be slidingly displaced in an arbitrary direction along the mounting surface of the mounting panel 11 (that is, generally the same direction as the direction of the resilient deformation) as shown in FIG. 10A. Also the connector body 40 can be inclined as indicated by two dots-and-dash lines in Fig. 10B. Therefore, even if the second connector 32 is slightly out of registry with the first connector 22, the two connectors can be properly connected together by slightly displacing the second connector 32.

Particularly in this structure, there are provided the holding portions 64 each cooperating with the turning spring portions 48 to hold the mounting panel 11 therebetween. The holding portions 64 are elastically deformable in the direction generally perpendicular to the mounting surface. Therefore the second connector 32 can be fixed to the mounting panel 11 in a more stable condition, utilizing the elastic restoring force of the holding portions 64, and the shaking of the second connector 32 is prevented. Further the degree of freedom of movement of the connector body 10 (particularly, the degree of freedom of inclination of the connector body 40) is sufficient because of the elastic deformation of the holding portions 64.

Besides, in this structure, the mounting panel 11 need only to have the through hole 70 for mounting the second connector 32, and the second connector 32 can be easily mounted on the mounting panel 11 without complicating the structure of the mounting panel 11 and without using the special connector holding member for holding the connector in a displaceable manner as in the conventional structure.

Guide parts for guiding the panel 10 and the unit 12 relative to each other in the connector-connecting direction are provided on the panel 10 and the unit 12. The guide parts prevent the unit 12 from the movement in a direction perpendicular to the connector-connecting direction until the unit 12 reaches a fitting initiation position (described later) where the two connectors 22 and 32 begin to be fitted together. After the unit 12 advances beyond the fitting initiation position, the position limitation by the guide parts are released, and the unit 12 is allowed to be displaced in the directions described above.

More specifically, as shown in FIGS. 1 and 2, the unit insertion recess 30 in the panel 10 comprises an inlet-side introductory portion 31a suitably larger in cross-sectional area than the unit 12, and an open portion 31b which is continuous from the introductory portion 31a, and is sufficiently larger in size than the introductory portion 31a in the right-left direction. A pair of guide grooves 38 are formed respectively in opposite (right and left) side surfaces of the introductory portion 31a, and extend in the connector-connecting direction, and communicate with the open portion 31b. The depth (dimension in the right-left direction) of the guide grooves 38 is so determined that the bottoms of the guide grooves 38 are disposed inwardly of the opposite (right and left) ends of the open portion 31b, respectively.

A pair of stabilizers 24, corresponding respectively to the guide grooves 38, are formed respectively on opposite (right and left) ends of the rear portion of the unit 12, and project right and left, respectively. When the unit 12 is inserted into the unit insertion recess 30, the stabilizers 24 are introduced respectively into the guide grooves 38, and are guided by them. Namely, the stabilizers 24 and the guide grooves 38 jointly constitute the guide parts.

The dimension of the introductory portion 31a of the unit insertion recess 30 in the connector-connecting direction, as well as the dimension of the stabilizers 24, is so determined that when the unit 12 reaches the fitting initiation position (indicated by two dots-and-dash lines in FIG. 2) during insertion of the unit 12 into the unit insertion recess 30 (that is, the front side of the housing of the second connector 32 is slightly fitted in the housing of the first connector 22, with the pins 34 on the panel 10 not yet inserted into the respective positioning holes 16 in the unit 12), the stabilizers 24 on the unit 12 are disengaged from the respective guide grooves 38 to become received in the open portion 31b, and also the dimensions of the stabilizers 24 and the guide grooves 38 are so determined that a clearance between the stabilizer 24 and guide groove 38 is small.

With this structure, the stabilizers 24 are kept retained in the respective guide grooves 38 until the unit 12 reaches the above fitting initiation position, thereby preventing the unit 12 from being displaced in a direction perpendicular to the connector-connecting direction. After the unit 12 advances beyond the fitting initiation position, the stabilizers 24 are disengaged from the respective guide grooves 38 to become received in the open portion 31b. Accordingly, the unit 12 is allowed to be displaced in a direction perpendicular to the connector-connecting direction within the range of a clearance between the unit 12 and the inner surface of the unit insertion recesses 30.

A procedure of mounting the unit 12 of the above structure to the panel 10 will be described.

First, as shown in FIGS. 1 and 2, the unit 12 is so arranged that the first connector 22 is opposed to the panel 10, and in this condition the unit 12 is pushed into the unit insertion recess 30 while the stabilizers 24 is received respectively in the right and left guide grooves 38.

At this time, until the unit 12 reaches the fitting initiation position, the stabilizers 24 are guided respectively by the guide grooves 38. Therefore the unit 12 is inserted without being displaced in other direction than the connector-connecting direction. Therefore, the unit 12 is pushed into the fitting initiation position, with the position and direction of the first connector 22 kept in such a condition that the first connector 22 can be suitably connected to the second connector 32, and then the housings of the two connectors 22 and 32 begin to be fitted together. Therefore, merely by pushing the unit 12, the two connectors 22 and 32 can be easily and positively connected together without the need for positioning the two connectors 22 and 32.

Then, when the unit 12 is pushed into a position where the flanges 14 are close to the front surface of the panel 10, the pins 34 are fitted respectively into the positioning holes 16, and the unit 12 is further pushed, so that the unit 12 is positioned relative to the panel 10.

At this stage at which the pins 34 are to be passed respectively through the positioning holes 16, the unit 12 has already advanced beyond the fitting initiation position, and the unit 12 can be displaced in a direction perpendicular to the connector-connecting direction. Therefore, the pins 34 can be passed respectively through the positioning holes 16 while displacing the unit 12 relative to the panel 10. At this time, although the housing of the second connector 32 is slightly fitted in the housing of the first connector 22, the second connector 32 can be displaced in unison with the unit 12 during this positioning operation since the second connector 32 is mounted for allowing the movement in a direction perpendicular to the connector-connecting direction as described above. Therefore, during the positioning of the unit 12, a strain and the like will not develop in the two connectors 22 and 32, the panel 10 and the flanges 14 of the unit 12.

Figure 3:
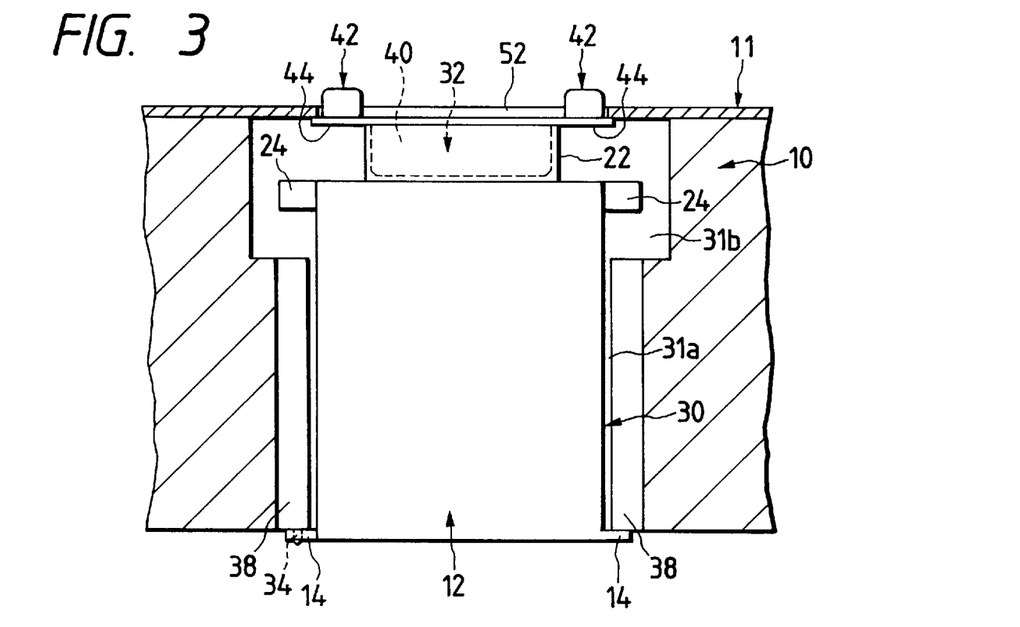
FIG. 3 is a view similar to FIG. 2, but showing a condition in which the mounting of the instrument unit on the instrument panel is completed.

Then, the unit 12 is further pushed to bring the flanges 14 into contact with the front surface of the panel 10, so that the two connectors 22 and 32 are completely connected together (This condition is shown in FIG. 3), and then the bolts are passed through the respective bolt insertion holes 18 formed through the respective flanges 14, and are threaded into the respective screw holes 36, so that the mounting of the unit 12 on the panel 10 is completed.

Thus, with this structure, the first and second connectors 22 and 32 can be easily and reliably connected together when connecting the unit 12 to the panel 10, and besides the panel 10 and the unit 10 can be suitably interconnected in a positioned condition without producing a strain and the like in any portion of the panel 10 and the unit 12.

The above embodiment is a representative example of the interconnecting structure of the invention, and its specific structure can be suitably modified without departing from the scope of the invention.

Figure 11:
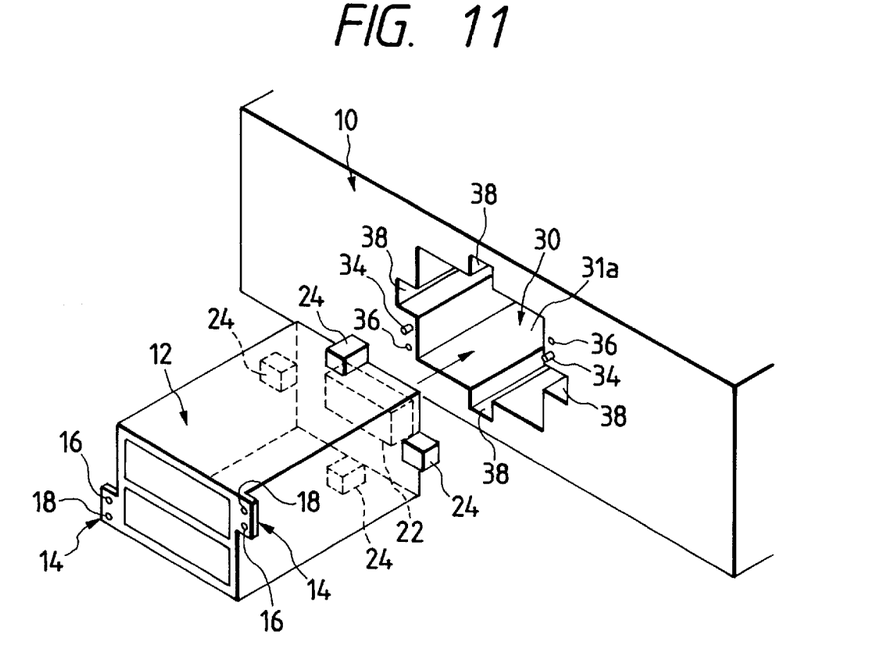
FIG. 11 is a schematic, perspective view showing modified guide parts applied to the instrument panel and the instrument unit.
Figure 12:
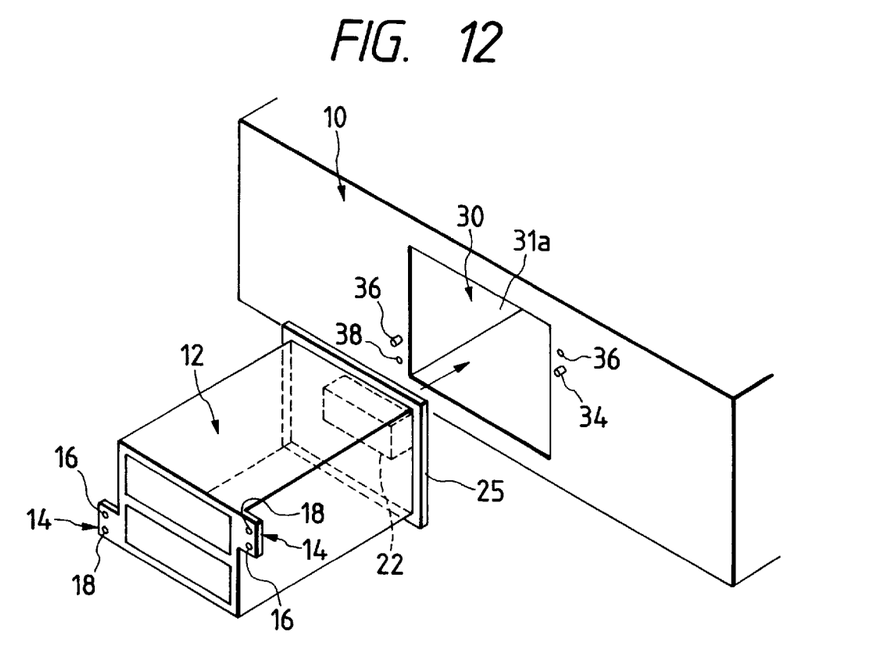
FIG. 12 is a schematic, perspective view showing another modified guide parts applied to the instrument panel and the instrument unit.

For example, although the above embodiment has the pair of stabilizers 24 projecting respectively from the opposite (right and left) sides of the unit 12, and the pair of guide grooves 38 formed in the inner surface of the unit insertion recess 30 in the panel 10 for respectively guiding the stabilizers 24, this may be replaced by other guide members shown respectively in FIGS. 11 and 12.

More specifically, in the structure shown in FIG. 11, stabilizers 24 are formed in a projected manner on the upper and lower surfaces and right and left side surfaces of the unit 12, respectively, and these stabilizers 24 are guided respectively by guide grooves 38 formed respectively in the upper and lower surfaces and right and left side surfaces of the unit insertion recess 30. In this structure, the position of the unit 12 is limited not only by the right and left stabilizers 24 but also by the upper and lower stabilizers 24, and therefore an unnecessary movement of the unit 12 before the unit 12 reaches the fitting initiation position can be more positively prevented as compared with the above embodiment, thereby enabling the two connectors 22 and 32 to be more easily and reliably connected together. In the structure shown in FIG. 12, a flange 25 is formed perpendicularly on the unit 12 over the entire periphery thereof, and a unit insertion recess 30 has a cross-sectional shape corresponding to this flange 25, and the outer peripheral edge of the flange 25 is guided by the entire inner peripheral surface of the unit insertion recess 30. In this structure, since there is no need to provide the guide grooves 38 of the above embodiment, the configuration of the unit insertion recess 30 is simplified, and the panel 10 can be produced easily. In this structure, it is not always necessary to provide the flange 25 over the entire periphery of the unit 12, but flanges may be formed respectively at corner portions of the unit 12 (see FIG. 13), in which case these flanges are guided respectively by corner portions of the inner peripheral surface of the unit insertion recess 30.

Figure 13:
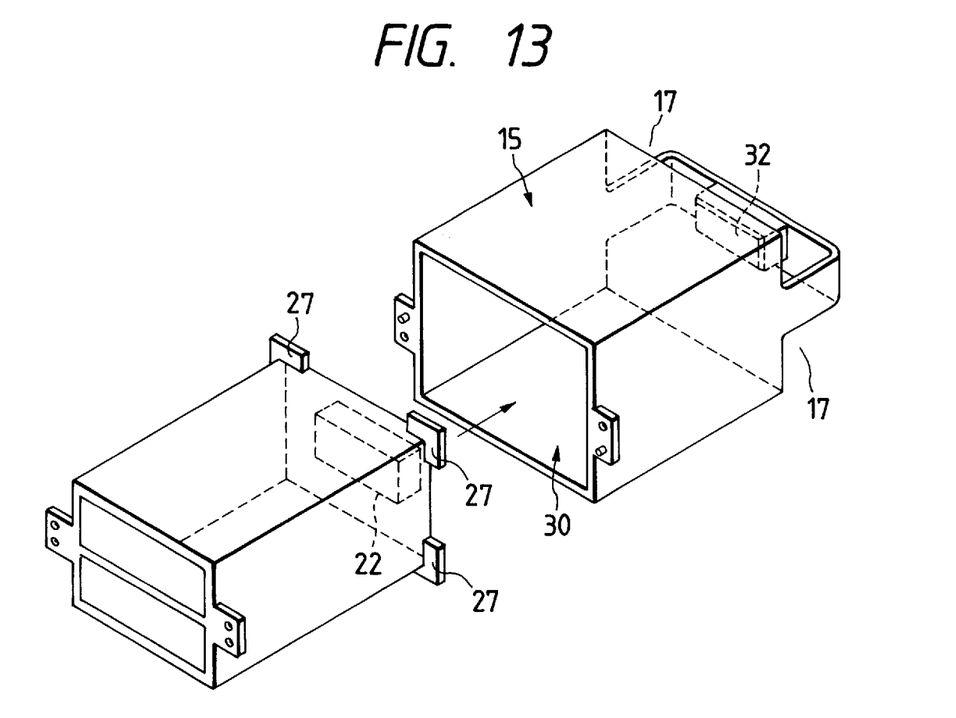
FIG. 13 is a schematic, perspective view showing guide parts in a structure of mounting an instrument unit in a socket.
Figure 14:
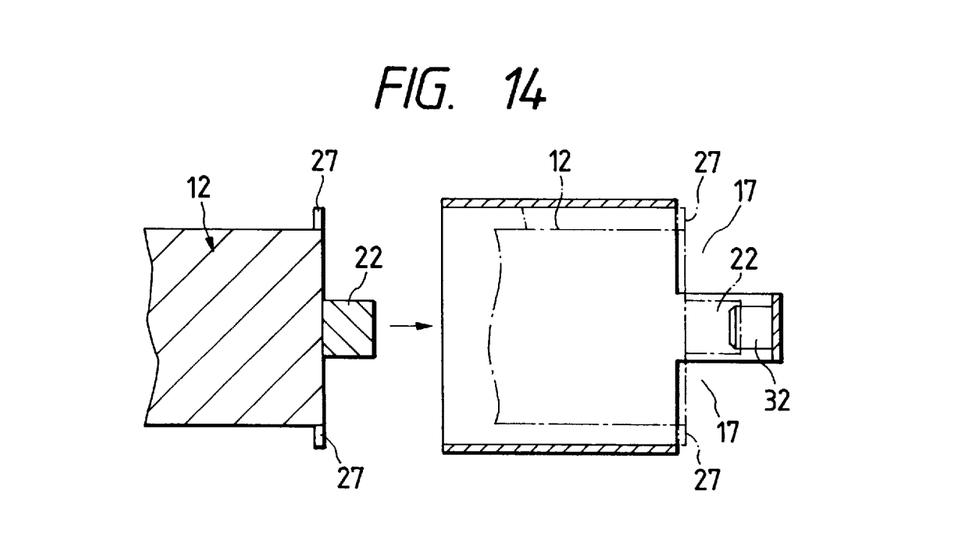
FIG. 14 is a schematic, cross-sectional view showing the instrument unit and the socket shown in FIG. 13.

In the above embodiment, the unit insertion recess 30 is defined by the introductory portion 31a and the open portion 31b, and when the stabilizers 24 are disengaged respectively from the guide grooves 38 formed at the introductory portion 31a, and become received in the open portion 31b, the unit 12 can be displaced in a direction perpendicular to the connector-connecting direction. However, for example, in the type of structure (shown in FIG. 13) in which the unit 12 is inserted into and attached to a box-shaped socket 15 having a unit insertion recess 30, there may be used an arrangement in which flanges 27 are formed respectively at corner portions of the outer peripheral surface of the unit 12 as shown in FIG. 13, and these flanges are guided respectively by corner portions of the inner peripheral surface of the unit insertion recess 30, and notches 17, corresponding respectively to the open portions 31b in the panel 10, are formed respectively in upper and lower walls of the socket 15 at a rear end portion thereof. With this structure, until the unit 12 reaches a predetermined position, the flanges 27 are guided by the corner portions of the inner peripheral surface of the unit insertion recess 30, and therefore the unit 12 is prevented from movement in a direction perpendicular to the connector-connecting direction, and then when the flanges 27 reach the notches 17 as shown in FIG. 10, the limitation of the position of the flanges is released, so that the unit 12 can be displaced in a direction perpendicular to the connector-connecting direction.

In the above embodiment, although the stabilizers 24, formed in a projected manner on the unit 12, are guided respectively by the guide grooves 38 formed in the panel 10, stabilizers may be formed in a projected manner on the inner surface of the unit insertion recess 30, and guide grooves may be formed in the unit 12. In this case, a recess is formed in the surface of the unit 12, and when the unit 12 reaches the fitting initiation position, the stabilizers are disengaged respectively from the guide grooves to be received in this recess. With this structure, also, similar effects as achieved by the unit 12 and the panel 10 in the above embodiment can be obtained.

Figure 15:
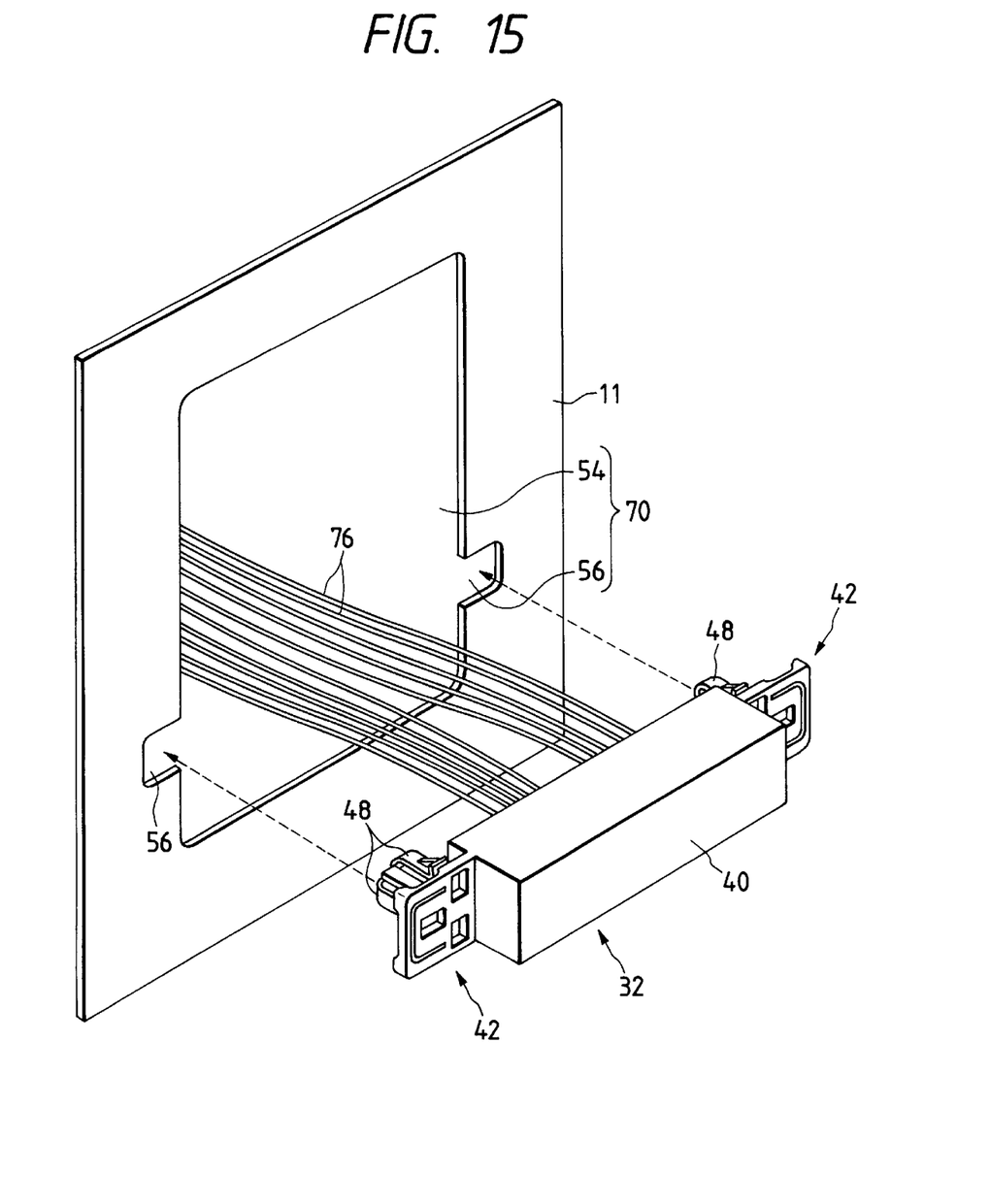
FIG. 15 is a perspective view showing a connector having a wire, as well as a connector mounting structure.

In addition, the feature with respect to mounting the second connector is not limited in the above case which the two units interconnect. As shown in FIG. 15, when the second connector 32 has a number of wires 76, at first, the second connector 32 is passed through the through hole 70 from the reverse side (the back side in FIG. 1) of the mounting panel 11 to the front side of the mounting panel 11. In this case, the height (vertical dimension) of the rectangular portion 54 has such a size that the second connector 32 can be passed through the rectangular portion 54 at least when the second connector 32 is inclined.

Figure 16:
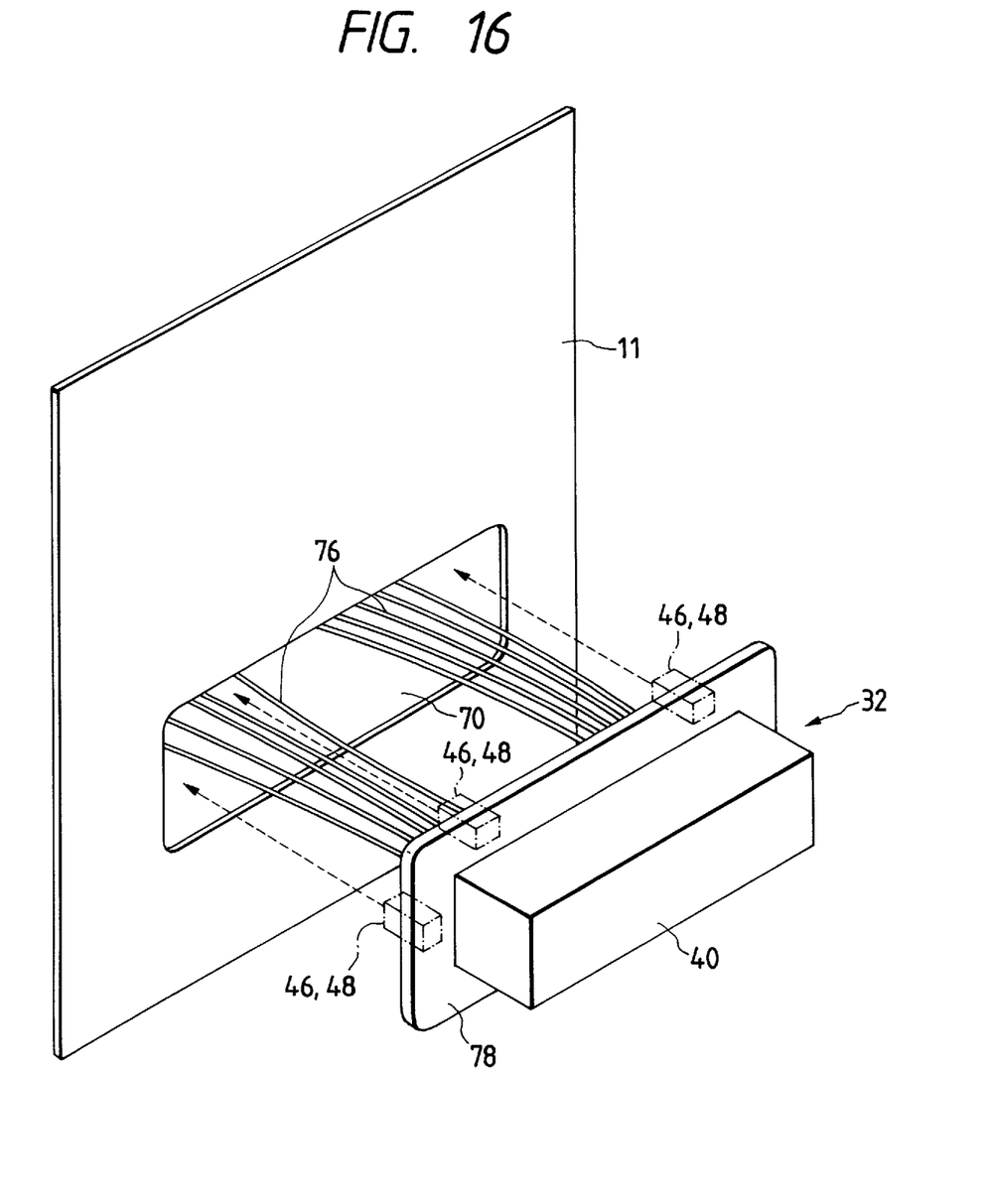
FIG. 16 is a perspective view showing a modified connector having a wire, as well as a connector mounting structure.

Moreover, the portions where the turning spring portions 18 are provided are not limited to those of the above embodiment and for example, as shown in FIG. 16, there may be used an arrangement in which a flange 78 is formed on a connector body 40 over an entire periphery thereof, and spring support posts 46 are formed respectively on a plurality of portions of this flange 78 spaced from one another in the direction of the periphery, and project toward the mounting panel 11, and a turning spring portion 48 on each spring support post 46 is turned to the outer side. With this arrangement, the second connector 32 can be attached to the mounting panel 11. In this case, also, the direction of resilient deformation of part of the turning spring portions 48 is generally perpendicular to the direction of resilient deformation of the other turning spring portions 48 so that the second connector 32 can be displaced in a plurality of directions generally perpendicular to each other.

In this case, however, the configuration of a through hole 70 must be so determined that the distal ends of the turning spring portions 48 can be engaged with a peripheral edge portion of the through hole 70. Therefore the area of the through hole 70 is substantially limited, and the through hole 70 can not be formed into such a size as to enable the whole of the second connector 32 to pass therethrough. Therefore, first, only the wires 76 are passed through the through hole 70 from the reverse side of the mounting panel 11 to the front side thereof, and then these wires 76 are connected to the second connector 32, and thereafter the mounting of the second connector 32 must be effected.

On the other hand, in FIGS. 4 or 15, the spring mounting portions 42 are provided respectively at the opposite ends (the right and left ends in the drawings) of the connector body 40, all of the turning spring portions 48 are provided on these spring mounting portions 42 in a concentrated manner. With this arrangement the overall configuration of the through hole 70 is not limited except that the spring mounting holes 32, corresponding to the turning spring portions 48, are formed, and therefore the area of the through hole 70 can be made sufficiently large so as to allow the whole of the second connector 32 to pass therethrough. This achieves an advantage that the wires 76 can be beforehand connected to the second connector 32 at a different site, and then the second connector 32 can be attached to the mounting panel 11.

The plurality of turning spring portions 48 extend from the common spring support post 46 as in the illustrated embodiment, and with this arrangement there is achieved an advantage that the configuration of the second connector 32 is simplified.

The foregoing description of a preferred embodiment of the invention has been presented for purpose of illustration and description. It is not intended to be exhaustive or to limit the invention to the precise form disclosed, and modifications and variations are possible in light of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

As described above, in the unit interconnecting structure of the present invention, the first unit, having the first connector, is connected to the second unit having the second connector, with the housings of the two connectors fitted together, in a condition in which the two units are positioned relative to each other by the positioning parts, and the two units are guided relative to each other by the guide means until one of the two units reaches the predetermined fitting initiation position, thereby fitting the housings of the two connectors together easily and positively, and after the unit advances beyond the fitting initiation position, the position limitation by the guide means is released, thereby allowing the relative movement of the two units in other direction than the connector-connecting direction. Therefore, the two units can be interconnected while suitably positioning the two units relative to each other by the positioning means. And besides, one of the connectors is mounted for allowing the movement in a direction perpendicular to the connector-connecting direction, and therefore even if there is an error in the mounting position of the two connectors, this error can be absorbed by the movement of the one connector, and therefore the connection between the two connectors, as well as the connection between the two units, can be effected smoothly.

Particularly in the case where the two units are interconnected in such a manner that the first unit is inserted in the second unit, the guide means includes the projection formed on one of the two units, and the guide portion formed at the other unit for guiding the projection, and the other unit, provided with the guide portion, has the portion for allowing the movement of the projection in a direction perpendicular to the connector-connecting direction in the range from the fitting initiation position to a position where the two connectors are fitted together. With this structure, the above effects can be achieved. In this case, the guide portion can comprise the groove extending in the connector-connecting direction, and the projection is received in and guided by this groove, and by doing so, the guide means can be formed with the simple structure.

In the case where the insertion portion of the second unit for receiving the first unit is formed into a polygonal cross-sectional shape, the projection comprises the flange which is formed on the outer periphery of the first unit, and corresponds at least to the corner portions of the cross-section of the insertion portion, and has a shape conforming to the cross-sectional shape of the insertion portion. With this structure, the inner surface of the insertion portion can be used as the guide portion without the need for the groove. Particularly in the case where the second unit is formed into a box-shape, the portion for allowing the movement of the projection is formed by notches formed in the second unit. With this structure, the above effects can be achieved while simplifying the structure of the second unit.

Further, the spring support portions are provided respectively at a plurality of portions of the connector body at the peripheral portion thereof, and extend respectively through those portions of the through hole adjacent to the peripheral edge of the through hole, and the turning spring portion extends from each of the spring support portion, and is turned to the peripheral edge of the through hole, and the turning spring portion has such a configuration that it can be resiliently deformed in a direction generally parallel to the connector mounting surface, and that the distal end portion of the turning spring portion is engageable with the peripheral edge of the through hole, and the connector body can be slightly displaced in accordance with the resilient deformation of the turning spring portions. Therefore, in contrast with the conventional structure, the structure of the mounting member is not complicated, and a special member for holding the connector in a slightly displaceable manner is not needed, and the connector can be easily mounted on the mounting member with the simple structure having a reduced number of component parts.

The spring support portions and the turning spring portions can be molded integrally with the connector body, and with this arrangement the connector can be simplified in structure.

In one preferred form of the invention, the holding portions are formed on the connector body, and cooperate with the turning spring portions to hold the peripheral edge portion of the through hole therebetween, and the holding portions are elastically deformable in a direction generally perpendicular to the mounting surface of the mounting member. With this structure, the connector can be mounted more stably as compared with the case where the connector is mounted only by the engagement of the turning spring portions with the peripheral edge portion of the through hole, and besides the degree of freedom of movement of the connector body is sufficient because of elastic deformation of the holding portions.

The direction of resilient deformation of part of the turning spring portions can be generally perpendicular to the direction of resilient deformation of the other turning spring portions, and with this arrangement the connector body can be displaced in almost all directions, and the mounted condition of the connector is flexible.

With respect to the arrangement of the spring support portions and the turning spring portions, the spring mounting portions are formed respectively at the opposite ends of the connector body spaced from each other in a predetermined direction, and the spring support portion, as well as the plurality of turning spring portions resiliently deformable in different directions, are provided in a concentrated manner on each of the spring mounting portions. With this structure, the overall configuration of the through hole can be made large enough to allow the whole of the connector to pass therethrough. With this arrangement, the connector, having wires connected thereto, can be suitably mounted on the mounting member, and advantageously, the efficiency of the mounting operation is enhanced.

What is claimed is:

1. A unit interconnecting structure comprising:

a first unit having a first connector;

a second unit having a second connector, said second unit connected to said first unit; and guide means for guiding said first and second units relative to each other in the connector-connecting direction, said guide means provided on said first and second units;

wherein at least one of said first and second connectors is mounted to allow the movement relative to the associated unit in a direction perpendicular to a connector-connecting direction;

further wherein at the time of interconnecting said first and second units, said guide means guides said first and second units relative to each other until one of said first and second units reaches a predetermined fitting initiation position where housings of said first and second connectors begin to be fitted together, and said guide means releases one of said first and second units to allow the movement of said one unit relative to the associated unit in a direction perpendicular to the connector-connecting direction when one of said first and second units moves beyond said fitting initiation position.

2. A unit interconnecting structure according to claim 1, further comprising:

positioning means for positioning said first and second units relatively to each other while said housings are fitted together; said positioning means provided in said first and second units.

3. A unit interconnecting structure according to claim 1, wherein said guide means comprises:

a projection formed on one unit of said first and second units; and a guide portion formed at another unit of said first and second units for guiding said projection;

wherein said first and second units are interconnected in such a manner that said first unit is inserted in said second unit, and said another unit has a portion for allowing the movement of said projection in a direction perpendicular to the connector-connecting direction in a part from said fitting initiation position to a position where said two connectors are fitted together.

4. A unit interconnecting structure according to claim 3, wherein said guide portion comprises:

a groove for receiving said projection, said groove extending in the connector-connecting direction.

5. A unit interconnecting structure according to claim 3, wherein an insertion portion of said second unit for receiving said first unit is formed into a polygonal cross-sectional shape, and said projection comprises a flange which is formed on an outer periphery of said first unit, said flange corresponding to at least corner portions of the cross-section of said insertion portion, said flange having a shape conforming to the cross-sectional shape of said insertion portion.

6. A unit interconnecting structure according to claim 4, wherein said second unit is formed into a box-shape having an insertion portion for receiving said first unit, and said portion for allowing the movement of said projection is formed by notches formed in said second unit.

7. A connector for use with a mounting member, said connector comprising:

a connector body fitted in a through hole formed through said mounting member;

a spring support portion which is provided respectively at a peripheral portion of said connector body, and is extended respectively through said through hole adjacent to a peripheral edge thereof;

turning spring portions which are extended from said spring support portion, and are turned to the peripheral edge of said through hole, wherein said turning spring portions are resiliently deformable in a direction substantially parallel to a connector mounting surface, and a distal end portion of each of said turning spring portions is engageable with the peripheral edge of said through hole, to thereby simultaneously retain said connector body in said through hole and allow said connector body to be slightly displaced in a direction substantially parallel to the connector mounting surface in accordance with the resilient deformation of said turning spring portions.

8. A connector according to claim 7, wherein said spring support portion and said turning spring portions are molded integrally with said connector body.

9. A connector according to claim 7, further comprising;

a holding portion formed on said connector body to hold the peripheral edge of said through hole;

wherein said holding portion are elastically deformable in a direction substantially perpendicular to the mounting surface of said mounting member.

10. A connector according to claim 7, wherein the direction of resilient deformation of one of said turning spring portions is substantially perpendicular to the direction of resilient deformation of at least one of the other turning spring portions.

11. A connector according to claim 7, further comprising:

spring mounting portions formed respectively at opposite ends of said connector body spaced from each other in a predetermined direction, wherein said spring support portions, as well as said turning spring portions resiliently deformable in different directions, is provided in a concentrated manner on each of said spring mounting portions.

12. A connector according to claim 11, wherein each of said turning spring portions extends from the common spring support portion in different directions.

13. A connector mounting structure comprising:

a mounting member having a through hole; and a connector mounted on said mounting member, said connector comprising;

a connector body received and fitted in said through hole formed through said mounting member;

a spring support portion provided respectively at a peripheral portion of said connector body, and extended respectively through said through hole adjacent to a peripheral edge thereof;

turning spring portions extended from said spring support portion, and turned to the peripheral edge of said through hole, said turning spring portions having such a configuration that allows said turning spring portions to be resiliently deformed in a direction generally parallel to a connector mounting surface, and that a distal end portion of each of said turning spring portions is engageable with the peripheral edge of said through hole, to thereby simultaneously retain said connector body in said through hole and allow said connector body to be slightly displaced in a direction generally parallel to the connector mounting surface in accordance with the resilient deformation of said turning spring portions;

wherein said through hole is formed and said turning spring portions are positioned so that said turning spring portions are engaged with the peripheral edge of said through hole, while said connector body is fitted in said through hole.

14. A connector mounting structure according to claim 13, wherein said spring support portion and said turning spring portions are molded integrally with said connector body.

15. A connector mounting structure according to claim 13, wherein said connector further comprises;

a holding portion formed on said connector body to hold the peripheral edge of said through hole;

wherein said holding portion are elastically deformable in a direction substantially perpendicular to the mounting surface of said mounting member.

16. A connector mounting structure according to claim 13, wherein the direction of resilient deformation of one of said turning spring portions is substantially perpendicular to the direction of resilient deformation of at least one of the other turning spring portions.

17. A connector mounting structure according to claim 13, wherein said through hole is formed so that the whole of the connector allows to be passed through said through hole.

18. A connector mounting structure according to claim 13, wherein said connector further comprises:

spring mounting portions formed respectively at opposite ends of said connector body spaced from each other in a predetermined direction, said spring support portions, as well as said turning spring portions resiliently deformable in different directions, provided in a concentrated manner on each of said spring mounting portions.

19. A connector mounting structure according to claim 18, wherein each of said turning spring portions extends from the common spring support portion in different directions.

20. A connector mounting structure according to claim 18, wherein said through hole is formed so that the whole of the connector allows to be passed through said through hole.

21. A connector according to claim 7, wherein each of said turning spring portions includes an abutment piece portion, said abutment piece portion including a notch for engaging said through hole.

22. A connector mounting structure according to claim 13, wherein each of said turning spring portions includes an abutment piece portion, said abutment piece portion including a notch for engaging said through hole.

* * * * *